(12) United States Patent  (10) Patent No.: US 8,173,535 B2
Tivarus  (45) Date of Patent: May 8, 2012

(54) WAFER STRUCTURE TO REDUCE DARK CURRENT

(75) Inventor: Cristian A. Tivarus, Rochester, NY (US)

(73) Assignee: OmniVision Technologies, Inc., Santa Clara, CA (US)

( * ) Notice: Subject to any disclaimer, the term of this patent is extended or adjusted under 35 U.S.C. 154(b) by 191 days.

(21) Appl. No.: 12/642,909

(22) Filed: Dec. 21, 2009

(65) Prior Publication Data

US 2011/0147879 A1  Jun. 23, 2011

(51) Int. Cl.
*H01L 21/44* (2006.01)
*H01L 31/102* (2006.01)

(52) U.S. Cl. ........................................ 438/607; 257/463
(58) Field of Classification Search ................. 117/4, 89; 257/461–464; 438/48, 607
See application file for complete search history.

(56) References Cited

U.S. PATENT DOCUMENTS

| 5,951,755 | A  | * | 9/1999  | Miyashita et al. ............. 117/89 |
| 6,441,411 | B2 |   | 8/2002  | Nozaki et al. |
| 6,566,277 | B1 | * | 5/2003  | Nakagawa et al. ........... 438/761 |
| 6,683,360 | B1 |   | 1/2004  | Dierickx |
| 7,147,711 | B2 |   | 12/2006 | Tamatsuka et al. |
| 2002/0157597 | A1 | * | 10/2002 | Takeno ............................ 117/4 |
| 2007/0045682 | A1 |   | 3/2007  | Hong et al. |
| 2007/0298591 | A1 |   | 12/2007 | Cha |
| 2009/0035888 | A1 |   | 2/2009  | Lavine et al. |
| 2009/0152685 | A1 |   | 6/2009  | Adachi et al. |

FOREIGN PATENT DOCUMENTS

WO  WO 2008/146442 A1  12/2008

* cited by examiner

*Primary Examiner* — Calvin Lee
(74) *Attorney, Agent, or Firm* — Blakely, Sokoloff, Taylor & Zafman

(57) ABSTRACT

A wafer structure for an image sensor includes a substrate that has a given conductivity type, a given dopant concentration, and a given concentration of oxygen. An intermediate epitaxial layer is formed over the substrate. The intermediate epitaxial layer has the same conductivity type and the same, or substantially the same, dopant concentration as the substrate but a lower oxygen concentration than the substrate. A thickness of the intermediate epitaxial layer is greater than the diffusion length of a minority carrier in the intermediate layer. A device epitaxial layer is formed over the intermediate epitaxial layer. The device epitaxial layer has the same conductivity type but lower dopant and oxygen concentrations than the substrate.

10 Claims, 5 Drawing Sheets

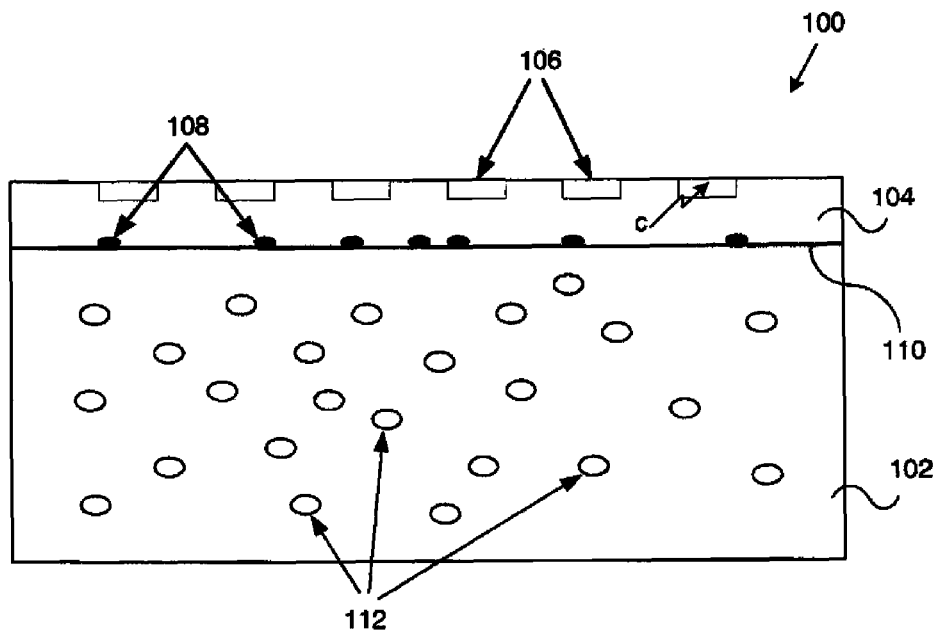
FIG. 1 - Prior Art
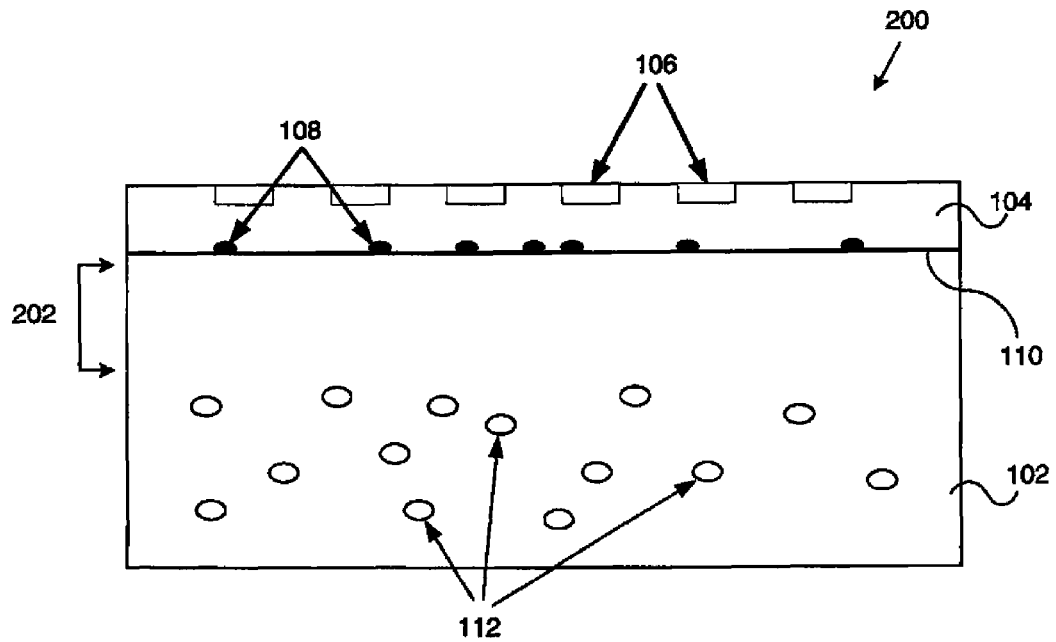
FIG. 2 - Prior Art

WAFER STRUCTURE TO REDUCE DARK CURRENT

TECHNICAL FIELD

The present invention relates generally to image sensors, and more particularly to a wafer structure for image sensors and a method for fabricating the wafer structure.

BACKGROUND

Dark current is charge generated in an image sensor when the image sensor is not exposed to light. Dark current is detrimental to device performance because the dark current decreases the sensitivity of the image sensor. And reduced sensitivity in an image sensor degrades the quality of image captured in low light conditions.

FIG. 1 is a cross-sectional view of a portion of a first image sensor according to the prior art. Image sensor 100 includes substrate 102 and epitaxial layer 104. Photosensitive regions 106 formed in epitaxial layer 104 are used to capture images by collecting photo-generated charge in response to incident light. Dark current "c" generated in image sensor 100 can diffuse to photosensitive regions 106 and combine with the photo-generated charge during image capture. Dark current adversely affects the quality of the captured image because the amount of charge collected by the photosensitive regions is incorrect and does not accurately reflect the scene being captured.

There are several sources for dark current in image sensor 100. One source is the interface state defects 108 that reside at the interface 110 between substrate 102 and epitaxial layer 104. Another source is metal contaminates, such as iron and gold, in both substrate 102 and epitaxial layer 104.

During the fabrication process of an image sensor, oxygen in substrate 102 forms oxygen precipitates 112. The oxygen precipitates 112 getter metal contaminates. Higher concentrations of oxygen lead to more oxygen precipitates and better gettering properties. When the oxygen precipitates 112 are close to interface 110, dark current generated by the metal atoms trapped at the precipitate sites and by the defects associated with the precipitates, can diffuse to photosensitive regions 106. One solution to this issue is to form the oxygen precipitates 112 a given distance away from interface 110.

FIG. 2 is a cross-sectional view of a portion of a second image sensor according to the prior art. Image sensor 200 includes region 202 that is depleted of oxygen so that oxygen precipitates 112 do not form in this region. Region 202 is part of the substrate 102 and is also known as a denuded zone. The thickness of region 202 depends on the oxygen concentration inside substrate 102 and the type of processes used to create that concentration. In general, for a given process, the thickness of region 202 increases as the oxygen concentration in substrate 102 decreases. However, as discussed earlier, higher oxygen concentration is preferred in order to create more oxygen precipitates and achieve better gettering performance. Additionally, creating region 202 usually requires thermal processing of substrate 102, before epitaxial layer 104 deposition, and at high temperatures for a long period of time. In a production environment that involves thousands of wafers, these extra processing steps can limit throughput and increase costs. And since these additional processing steps involve high temperatures, metal contaminants can easily diffuse in substrate 102 during these steps.

SUMMARY

A wafer structure for an image sensor includes a substrate that has a first conductivity type, a first dopant concentration, and a first oxygen concentration. An intermediate epitaxial layer is formed over the substrate. The intermediate epitaxial layer has the same conductivity type, and the same, or substantially the same, dopant concentration. Additionally, the intermediate epitaxial layer has a lower oxygen concentration than the substrate in an embodiment in accordance with the invention. The thickness of the intermediate epitaxial layer is greater than the diffusion length of the minority carriers corresponding to the dopant concentration of the layer.

A device epitaxial layer is formed over the intermediate epitaxial layer.

The device epitaxial layer has the same conductivity type as the intermediate epitaxial layer and substrate, but the device epitaxial layer has a lower dopant than the intermediate epitaxial layer and substrate. Additionally, the device epitaxial layer has a lower oxygen concentration than the substrate. The wafer structure is used to fabricate an image sensor. As such, photosensitive regions and other components and circuitry are formed in, or disposed on or over, the device epitaxial layer.

BRIEF DESCRIPTION OF THE DRAWINGS

Embodiments of the invention are better understood with reference to the following drawings. The elements of the drawings are not necessarily to scale relative to each other.

FIG. 1 is a cross-sectional view of a portion of a first image sensor according to the prior art;

FIG. 2 is a cross-sectional view of a portion of a second image sensor according to the prior art;

DETAILED DESCRIPTION

Figure 3:
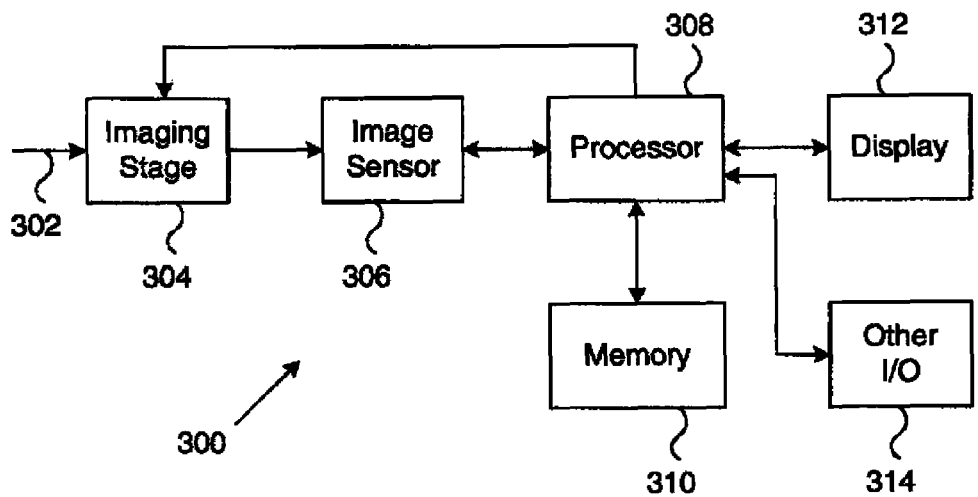
FIG. 3 is a simplified block diagram of an image capture device in an embodiment in accordance with the invention.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means either a direct electrical connection between the items connected or an indirect connection through one or more passive or active intermediary devices. The term "circuit" or "circuitry" means either a single component or a multiplicity of components, either active or passive, that are connected together to provide a desired function. The term "signal" means at least one current, voltage, or data signal.

Additionally, directional terms such as "on", "over", "top", "bottom", are used with reference to the orientation of the Figure(s) being described. Because components of embodiments of the present invention can be positioned in a number of different orientations, the directional terminology is used for purposes of illustration only and is in no way limiting. When used in conjunction with layers of an image sensor wafer or corresponding image sensor, the directional terminology is intended to be construed broadly, and therefore should not be interpreted to preclude the presence of one or more intervening layers or other intervening image sensor features or elements. Thus, a given layer that is described herein as being formed on or formed over another layer may be separated from the latter layer by one or more additional layers.

Referring to the drawings, like numbers indicate like parts throughout the views.

FIG. 3 is a simplified block diagram of an image capture device in an embodiment in accordance with the invention. Image capture device 300 is implemented as a digital camera in FIG. 3. Those skilled in the art will recognize that a digital camera is only one example of an image capture device that can utilize an image sensor incorporating the present invention. Other types of image capture devices, such as, for example, cell phone cameras, scanners, and digital video camcorders, can be used with the present invention.

In digital camera 300, light 302 from a subject scene is input to an imaging stage 304. Imaging stage 304 can include conventional elements such as a lens, a neutral density filter, an iris and a shutter. Light 302 is focused by imaging stage 304 to form an image on image sensor 306. Image sensor 306 captures one or more images by converting the incident light into electrical signals. Digital camera 300 further includes processor 308, memory 310, display 312, and one or more additional input/output (I/O) elements 314. Although shown as separate elements in the embodiment of FIG. 3, imaging stage 304 may be integrated with image sensor 306, and possibly one or more additional elements of digital camera 300, to form a camera module. For example, a processor or a memory may be integrated with image sensor 306 in a camera module in embodiments in accordance with the invention.

Processor 308 may be implemented, for example, as a microprocessor, a central processing unit (CPU), an application-specific integrated circuit (ASIC), a digital signal processor (DSP), or other processing device, or combinations of multiple such devices. Various elements of imaging stage 304 and image sensor 306 may be controlled by timing signals or other signals supplied from processor 308.

Memory 310 may be configured as any type of memory, such as, for example, random access memory (RAM), read-only memory (ROM), flash memory, disk-based memory, removable memory, or other types of storage elements, in any combination. A given image captured by image sensor 306 may be stored by processor 308 in memory 310 and presented on display 312. Display 312 is typically an active matrix color liquid crystal display (LCD), although other types of displays may be used. The additional I/O elements 314 may include, for example, various on-screen controls, buttons or other user interfaces, network interfaces, or memory card interfaces.

It is to be appreciated that the digital camera shown in FIG. 3 may comprise additional or alternative elements of a type known to those skilled in the art. Elements not specifically shown or described herein may be selected from those known in the art. As noted previously, the present invention may be implemented in a wide variety of image capture devices. Also, certain aspects of the embodiments described herein may be implemented at least in part in the form of software executed by one or more processing elements of an image capture device. Such software can be implemented in a straightforward manner given the teachings provided herein, as will be appreciated by those skilled in the art.

Figure 4:
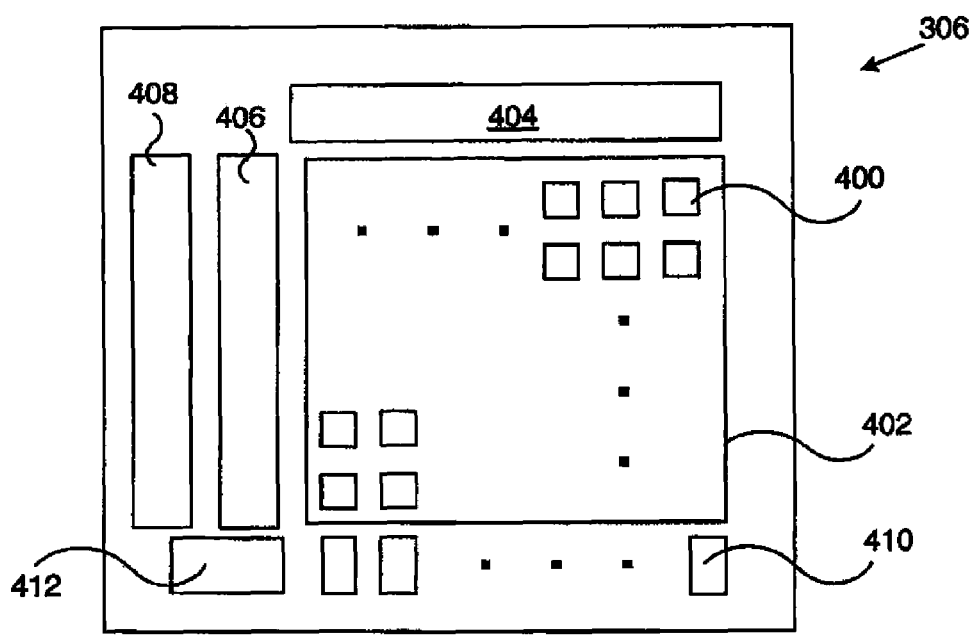
FIG. 4 is a block diagram of a top view of a first image sensor suitable for use as image sensor 306 in an embodiment in accordance with the invention.

Referring now to FIG. 4, there is shown a block diagram of a top view of a first image sensor suitable for use as image sensor 306 in an embodiment in accordance with the invention. Image sensor 306 includes multiple pixels 400 typically arranged in rows and columns that form an imaging area 402. Each pixel 400 includes a photosensitive region (not shown). Image sensor 306 further includes column decoder 404, row decoder 406, digital logic 408, multiple analog or digital output circuits 410, and timing generator 412. Each column of pixels 400 in imaging area 402 is electrically connected to an output circuit 410. Timing generator 412 generates the signals needed to read out signals from imaging area 402.

Image sensor 306 is implemented as an x-y addressable image sensor, such as, for example, a Complementary Metal Oxide Semiconductor (CMOS) image sensor, in an embodiment in accordance with the invention. Thus, column decoder 404, row decoder 406, digital logic 408, analog or digital output channels 410, and timing generator 412 are implemented as standard CMOS electronic circuits that are operatively connected to imaging area 402.

Functionality associated with the sampling and readout of imaging area 402 and the processing of corresponding image data may be implemented at least in part in the form of software that is stored in memory 310 (see FIG. 3) and executed by processor 308. Portions of the sampling and readout circuitry may be arranged external to image sensor 306, or formed integrally with imaging area 402, for example, on a common integrated circuit with photodetectors and other elements of the imaging area. Those skilled in the art will recognize that other peripheral circuitry configurations or architectures can be implemented in other embodiments in accordance with the invention.

Figure 5:
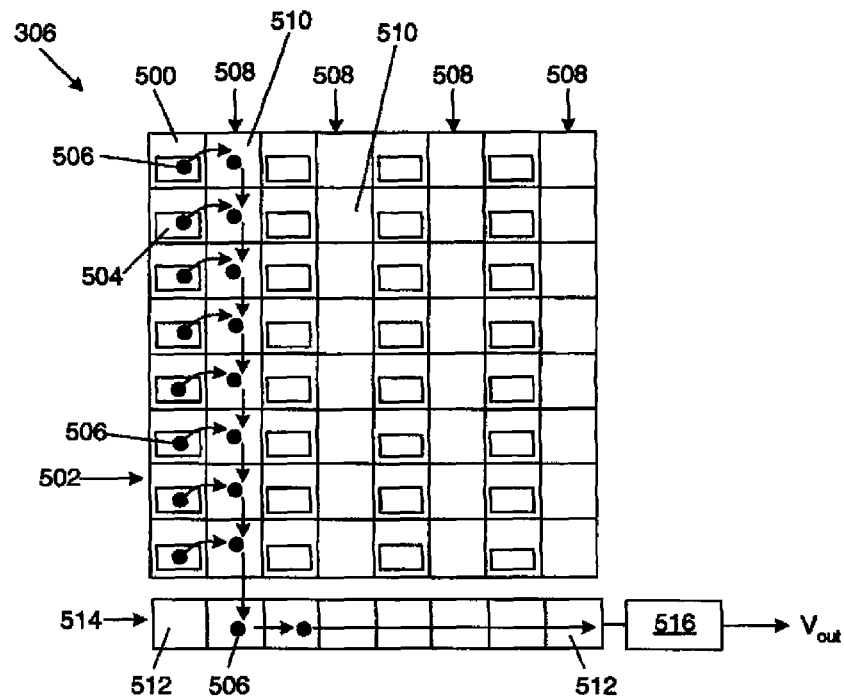
FIG. 5 is a block diagram of a top view of a second image sensor suitable for use as image sensor 306 in an embodiment in accordance with the invention.

FIG. 5 is a block diagram of a top view of a second image sensor suitable for use as image sensor 306 in an embodiment in accordance with the invention. Image sensor 306 is implemented as a Charge-Coupled Device (CCD) image sensor in the FIG. 5 embodiment. Image sensor 306 includes a number of pixels 500 typically arranged in rows and columns that form imaging area 502. Each pixel includes a photosensitive region 504 that collects charge carriers 506 in response to incident light. Vertical CCD shift registers 508 are positioned adjacent to each column of pixels.

To read out an image captured by the image sensor, appropriate bias voltage signals are generated by a timing generator (not shown) and applied to transfer regions or gates (not shown) disposed between the photosensitive regions 504 and respective shift elements 510 in the vertical CCD shift registers 508. The charge 506 in all of the vertical CCD shift registers 508 is then shifted in parallel one row at a time into shift elements 512 in horizontal CCD shift register 514. Each row of charge is then shifted serially one shift element 512 at a time through horizontal CCD shift register 514 to output circuit 516.

Figure 6:
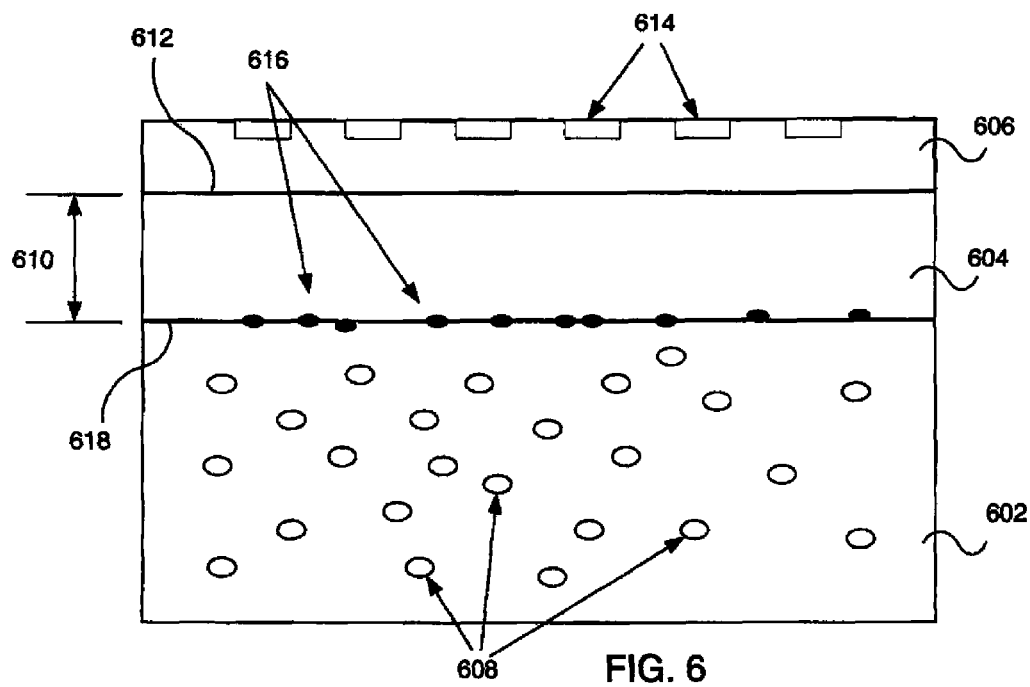
FIG. 6 is a cross-sectional view of an image sensor in an embodiment in accordance with the invention.

Referring now to FIG. 6, there is shown a cross-sectional view of an image sensor in an embodiment in accordance with the invention. Image sensor 600 includes substrate 602, intermediate epitaxial silicon layer 604 formed over substrate 602, and device epitaxial layer 606 formed over intermediate substrate layer 602. Substrate 602 is implemented with a semiconductor-based material including, but not limited to, silicon, silicon-on-insulator (SOI) technology, silicon-on-sapphire (SOS) technology, and other semiconductor structures.

One or more dopants are disposed in substrate 602. The dopant or dopants have a p-type conductivity and substrate 602 a p+ dopant concentration in an embodiment in accordance with the invention. Exemplary p-type dopants include, but are not limited to, boron and indium. By way of example only, the dopant concentration is in the range of $1\times10^{18}$ cm$^{-3}$ to $1\times10^{19}$ cm$^{-3}$. Other embodiments in accordance with the invention can configure substrate 602 differently. For example, the substrate can be doped with one or more n-type dopants, such as phosphorous and arsenic, or the substrate can have a different dopant concentration.

Substrate 602 further includes a known concentration of oxygen molecules and a known resistivity. Substrate 602 has an oxygen concentration of $1\times10^{17}$ to $2\times10^{17}$ atoms/cm$^3$ and a resistivity of 0.01 to 0.02 ohm–cm in an embodiment in accordance with the invention. Substrate 602 can have a different oxygen concentration and resistivity in other embodiments in accordance with the invention. During the fabrication process for an image sensor, the oxygen in substrate 602 forms oxygen precipitates 608.

Intermediate epitaxial layer 604 has a lower oxygen concentration than the oxygen concentration in substrate 602. In one embodiment in accordance with the invention, the oxygen concentration in the intermediate epitaxial layer is the lowest achievable oxygen concentration during epitaxial deposition. The low oxygen concentration reduces the number of oxygen precipitates that will form in the layer.

Intermediate epitaxial layer 604 is doped with one or more dopants having the same dopant type and the same, or substantially the same, dopant concentration and resistivity as substrate 602. Lattice mismatch is avoided when intermediate epitaxial layer 604 is doped with one or more dopants having the same conductivity type and the same, or substantially the same, dopant concentration and resistivity as substrate 602. Avoiding lattice mismatch allows intermediate epitaxial layer to be grown thicker (e.g., hundreds of microns thick) than prior art wafer structures, without generating defects such as dislocations.

Intermediate epitaxial layer 604 also has a thickness 610 that is based on the minority carrier diffusion length corresponding to the doping concentration of intermediate epitaxial layer 604. When intermediate epitaxial layer 604 is doped with p-type dopants, the minority carriers are electrons. Alternatively, the minority carriers are holes when intermediate epitaxial layer 604 is doped with one or more n-type dopants.

Figure 7:
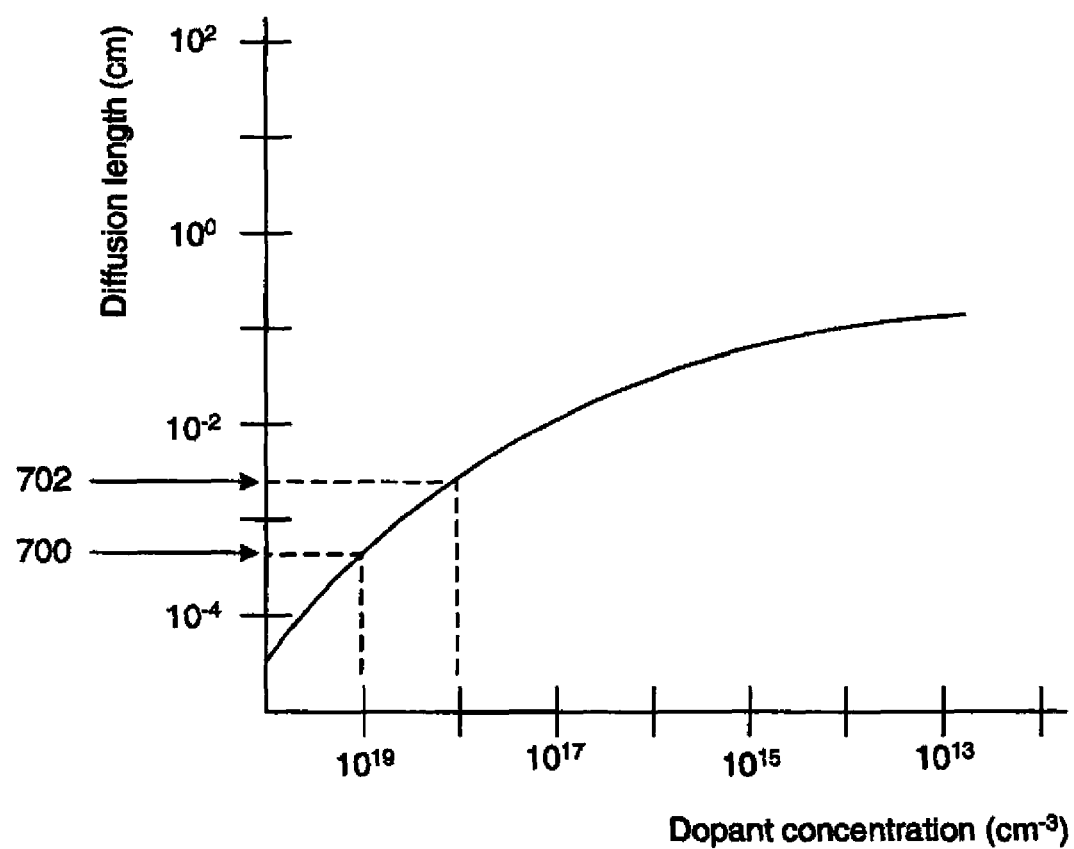
FIG. 7 is an illustration of an exemplary plot of dopant concentration versus minority carrier diffusion length in an embodiment in accordance with the invention.

FIG. 7 is an exemplary plot of dopant concentration versus minority carrier diffusion length in an embodiment in accordance with the invention. In the embodiment shown in FIG. 6, intermediate epitaxial layer 604 has a p-type conductivity, so the majority charge carriers are holes and the minority charge carriers are electrons. The concentration of the p-type dopant in FIG. 6 is in the range of $1\times10^{18}$ cm$^{-3}$ to $1\times10^{19}$ cm$^{-3}$. If the dopant concentration is $1\times10^{18}$ cm$^{-3}$, the electron diffusion length is the value at point 702. If the dopant concentration is $1\times10^{19}$ cm$^{-3}$, the electron diffusion length is the value at point 700. Thus, in the exemplary embodiment of FIG. 6, the electron diffusion length is in the range of approximately 4 to 30 microns.

The thickness 610 of intermediate epitaxial layer 604 should be greater than the diffusion length of the minority carriers. The thickness 610 of intermediate epitaxial layer 604 is determined so that diffusing minority carriers remain within intermediate epitaxial layer 604 and do not diffuse to, or past, interface 612 in FIG. 6. By way of example only, the thickness 610 of intermediate epitaxial layer 604 can be 2 to 5 times the minority carrier diffusion length in an embodiment in accordance with the invention.

Returning now to FIG. 6, device epitaxial layer 606 is formed over intermediate epitaxial layer 604. Photosensitive regions 614 and other components and circuitry for the image sensor are formed in, or disposed on, device epitaxial layer 606. Device epitaxial layer 606 is doped with one or more dopants having the same conductivity type as the dopant or dopants in intermediate epitaxial layer 604. The concentrations of the one or more dopants in device epitaxial layer 606 are lower than the concentrations of the one or more dopants in intermediate epitaxial layer 604 in an embodiment in accordance with the invention. By way of example only, the dopant concentration in device epitaxial layer 606 can be in the range of $1\times10^{15}$ cm$^{-3}$ to $1\times10^{16}$ cm$^{-3}$.

Device epitaxial layer 606 has a lower oxygen concentration than the oxygen concentration in substrate 602. In one embodiment in accordance with the invention, the oxygen concentration in the device epitaxial layer is the lowest achievable oxygen concentration during epitaxial deposition. The low oxygen concentration reduces the number of oxygen precipitates that will form in the layer.

Together substrate 602, intermediate epitaxial layer 604, and device epitaxial layer 606 form an improved wafer structure for image sensors. The improved wafer structure reduces dark current in several ways. Interface 612 is free of epi-substrate interface state defects 616 because the interface state defects 616 reside at interface 618. Dark current generated by interface states 616 cannot diffuse through the entire thickness of the intermediate layer 604 to photosensitive regions 614. The same is true for the dark current generated in the substrate 602 due to oxygen precipitates 608 and by metal atoms trapped at these oxygen precipitates.

Additional advantages to the improved wafer structure include the mitigation or elimination of dark current non-uniformity (dark current patterns) due to the presence of oxygen rings in the substrate, because epitaxial layers do not have oxygen rings structures and have low oxygen concentration. The improved wafer structure preserves the gettering properties of substrates where high oxygen content is needed. The epitaxial deposition process provides better control of the resistivity, thickness, oxygen concentration, and dopant concentration for the epitaxial layers. And finally, the improved wafer structure of the present invention preserves infrared sensitivity as compared with vertical overflow drain structures.

Figure 8:
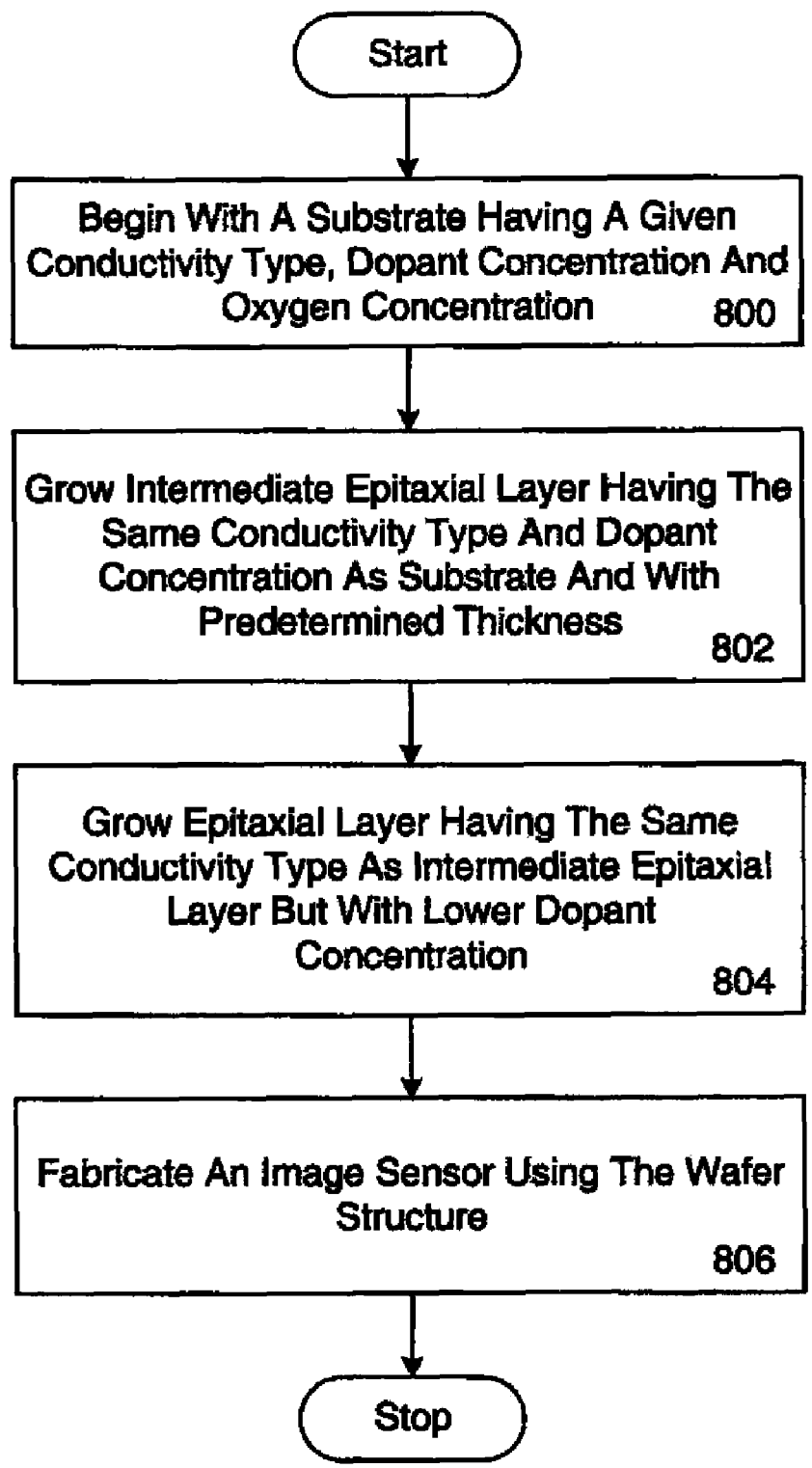
FIG. 8 is a flowchart of a method for fabricating a wafer structure in an embodiment in accordance with the invention.

Referring now to FIG. 8, there is shown a flowchart of a method for fabricating a wafer structure in an embodiment in accordance with the invention. The process begins with a substrate having a given conductivity type, dopant concentration and oxygen concentration, as shown in block 800. An intermediate epitaxial layer is then grown on the substrate (block 802). The intermediate epitaxial layer is formed such that is has the same conductivity type and the same, or substantially the same, dopant concentration and resistivity as the substrate. The intermediate epitaxial layer is also grown to a predetermined thickness that is based on a diffusion length of the minority carriers in the image sensor.

Next, as shown in block 804, a device epitaxial layer is grown on the intermediate epitaxial layer. The device epitaxial layer is formed with the same conductivity type as the dopant or dopants in the intermediate epitaxial layer. The concentration of the one or more dopants in the device epitaxial layer is lower than the concentration of the dopant or dopants in the intermediate epitaxial layer.

The substrate, intermediate epitaxial layer, and device epitaxial layer form a wafer structure in an embodiment in accordance with the invention. As shown in block 806, the wafer structure is processed further to fabricate an image sensor. For example, photosensitive regions and other components such as, CCD shift registers, drain regions, and overflow barrier regions, can be formed in device epitaxial layer for CCD image sensors. Alternatively, photosensitive regions and other components, such as, source/drain implants, drain regions, and isolation regions, can be formed in device epitaxial layer for CMOS image sensors.

One advantage to the method of FIG. 8 is that the intermediate and device epitaxial layers can be formed in the same epitaxial chamber, one after another, by simply changing the gas flux that carries the dopants to the silicon substrate. No additional fabrication steps are needed when fabricating the two epitaxial layers.

The invention has been described in detail with particular reference to certain preferred embodiments thereof, but it will be understood that variations and modifications can be effected within the spirit and scope of the invention.

Even though specific embodiments of the invention have been described herein, it should be noted that the application is not limited to these embodiments. In particular, any features described with respect to one embodiment may also be used in other embodiments, where compatible. And the features of the different embodiments may be exchanged, where compatible.

PARTS LIST 100 image sensor
102 substrate
104 epitaxial layer
106 photosensitive regions
108 interface state defects
110 interface between substrate and epitaxial layer
112 oxygen precipitates
200 image sensor
202 region
300 image capture device
302 light
304 imaging stage
306 image sensor
308 processor
310 memory
312 display
314 other input/output
400 pixel
402 imaging area
404 column decoder
406 row decoder
408 digital logic
410 multiple analog or digital output circuits
412 timing generator
500 pixel
502 imaging area
504 photosensitive region
506 charge carriers
508 vertical charge-coupled device shift register
510 shift elements
512 shift element
514 horizontal charge-coupled device shift register
516 output circuit
600 image sensor
602 substrate
604 intermediate epitaxial layer
606 device epitaxial layer
608 oxygen precipitates
610 thickness of intermediate epitaxial layer
612 interface between intermediate epitaxial layer and device epitaxial layer
614 photosensitive regions
616 interface state defects
618 interface between substrate and intermediate epitaxial layer 700 point representing diffusion length of minority carriers
702 point representing diffusion length of minority carriers

The invention claimed is:

1. A method for fabricating a wafer structure for an image sensor, the method comprising:
   forming an intermediate epitaxial layer over a substrate having a first conductivity type, a first dopant concentration, and a first oxygen concentration, wherein the intermediate epitaxial layer has the first conductivity type and the first dopant concentration as in the substrate but a lower oxygen concentration than the first oxygen concentration in the substrate, and wherein a thickness of the intermediate epitaxial layer is greater than the diffusion length of minority charge carriers in the intermediate layer; and
   forming a device epitaxial layer over the intermediate epitaxial layer, wherein the device epitaxial layer has the first conductivity type of the intermediate epitaxial layer and the substrate but includes a lower dopant concentration than the first dopant concentration in the intermediate epitaxial layer and the substrate and a lower oxygen concentration than the first oxygen concentration in the substrate.

2. The method of claim 1, wherein the conductivity type comprises a p conductivity type.

3. The method of claim 1, wherein the conductivity type comprises an n conductivity type.

4. A wafer structure for an image sensor, the wafer structure comprising:
   a substrate including a first conductivity type, a first dopant concentration, and a first oxygen concentration;
   an intermediate epitaxial layer disposed over the substrate, wherein the intermediate epitaxial layer includes the first conductivity type and the first dopant concentration as in the substrate but a lower oxygen concentration than the first oxygen concentration in the substrate, and wherein the thickness of the intermediate epitaxial layer is greater than the diffusion length of minority charge carriers in the intermediate layer; and
   a device epitaxial layer disposed over the intermediate epitaxial layer, wherein the device epitaxial layer includes the first conductivity type of the intermediate epitaxial layer and the substrate but includes a lower dopant concentration than the first dopant concentration in the intermediate epitaxial layer and the substrate and a lower oxygen concentration than the first oxygen concentration in the substrate.

5. The wafer structure as in claim 4, further comprising a plurality of photosensitive regions disposed in the device epitaxial layer.

6. The wafer structure as in claim 4, wherein the first conductivity type comprises a p conductivity type.

7. The wafer structure as in claim 4, wherein the first conductivity type comprises an n conductivity type.

8. An image capture device, comprising:
   an image sensor that includes a wafer structure comprising:
   a substrate including a first conductivity type, a first dopant concentration, and a first oxygen concentration;
   an intermediate epitaxial layer disposed over the substrate, wherein the intermediate epitaxial layer includes the first conductivity type and the first dopant concentration as in the substrate but a lower oxygen concentration than the first oxygen concentration in the substrate, and wherein the thickness of the intermediate epitaxial layer is greater than the diffusion length of minority charge carriers in the intermediate layer; and a device epitaxial layer disposed over the intermediate epitaxial layer, wherein the device epitaxial layer includes the first conductivity type of the intermediate epitaxial layer and the substrate but includes a lower dopant concentration than the first dopant concentration in the intermediate epitaxial layer and the substrate and a lower oxygen concentration than the first oxygen concentration in the substrate.

. The image capture device of claim 8, wherein the first conductivity type comprises a p conductivity type.

10. The image capture device of claim 8, wherein the first conductivity type comprises an n conductivity type.

\* \* \* \* \*